United States Patent
Hashim et al.

(10) Patent No.: US 11,641,198 B1
(45) Date of Patent: May 2, 2023

(54) WIDE VOLTAGE GATE DRIVER USING LOW GATE OXIDE TRANSISTORS

(71) Applicant: TEXAS INSTRUMENTS INCORPORATED, Dallas, TX (US)

(72) Inventors: Ahmed Essam Hashim, Gilbert, AZ (US); Karthikeyan Kandaswamy, Chandler, AZ (US); Abhishek Badarinath, Tempe, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/538,953

(22) Filed: Nov. 30, 2021

(51) Int. Cl.
| H03K 3/00 | (2006.01) |
| H03K 5/08 | (2006.01) |
| H03K 17/687 | (2006.01) |
| H03K 17/10 | (2006.01) |

(52) U.S. Cl.
CPC ................................. *H03K 17/102* (2013.01)

(58) Field of Classification Search
None
See application file for complete search history.

(56) References Cited

U.S. PATENT DOCUMENTS

| 5,608,595 A * | 3/1997 | Gourab | H03K 17/0826 |
| | | | 361/88 |
| 7,365,584 B2 * | 4/2008 | Bennett | H03K 17/166 |
| | | | 327/170 |
| 8,390,341 B2 * | 3/2013 | Sugie | H03K 17/687 |
| | | | 327/108 |
| 8,975,940 B2 * | 3/2015 | Hayashi | H03L 5/00 |
| | | | 327/321 |
| 9,077,324 B2 * | 7/2015 | Huang | H03K 5/08 |
| 9,673,812 B2 * | 6/2017 | Takano | H02M 1/08 |
| 10,217,734 B2 * | 2/2019 | Fukuhara | H02H 9/04 |

* cited by examiner

*Primary Examiner* — Kenneth B Wells
(74) *Attorney, Agent, or Firm* — Charles F. Koch; Frank D. Cimino

(57) ABSTRACT

A gate driver circuit includes first through third transistors, a first voltage clamp, and control logic. The first transistor has a first control input and first and second current terminals. The first current terminal couples to a first voltage terminal. The first voltage clamp couples between the first voltage terminal and the first control input. The second transistor couples between the first control input and the second voltage terminal. The third transistor couples between the first control input and the second voltage terminal. The third transistor is smaller than the second transistor. The control logic is configured to turn on both the second and third transistors to thereby turn on the first transistor, and the first control logic configured to turn off the second transistor after the first transistor turns on while maintaining in an on-state the third transistor to maintain the first transistor in the on-state.

20 Claims, 4 Drawing Sheets

$Vt1 = Vref + Vt(MC1)$
$Vt2 = Vref + Vt(MC1) + Vt(MC2)$

WIDE VOLTAGE GATE DRIVER USING LOW GATE OXIDE TRANSISTORS

BACKGROUND

A transistor has a control input and a pair of current terminals. In the example of a metal oxide semiconductor field effect transistor (MOSFET), the control input is the gate and the current terminals are the source and drain. A gate driver is a circuit that receives a digital control signal and produces an output voltage of a suitable magnitude to turn on and off the transistor.

SUMMARY

In one example, a gate driver circuit includes first, second, and third transistors, a first voltage clamp, and control logic. The first transistor has a first control input and first and second current terminals. The first current terminal couples to a first voltage terminal. The first voltage clamp couples between the first voltage terminal and the first control input. The second transistor couples between the first control input and the second voltage terminal. The third transistor couples between the first control input and the second voltage terminal. The third transistor is smaller than the second transistor. The control logic is configured to turn on both the second and third transistors to thereby turn on the first transistor. The first control logic is configured to turn off the second transistor after the first transistor turns on while maintaining in an on-state the third transistor to maintain the first transistor in the on-state.

DETAILED DESCRIPTION

In some applications, a transistor should be turned on with a gate-to-source voltage (Vgs) of, for example, 7V or higher. Such applications include buck converters and motor controllers, both of which include a high side (HS) transistor coupled to a low side (LS) transistor at a switch node. The gate driver for each HS and LS transistor, therefore, should be able to produce a suitably sized output voltage (e.g., 7V or higher). However, many semiconductor processes produce transistors for use in gate drivers that have a maximum rating for their Vgs that is smaller than the voltage needed to be produced on the output of the gate driver. Such transistors have limited Vgs voltage ratings due to the thin gate oxide layers formed on the gates of the transistors. In one example, 5V (Vgs) rated transistors are used in a gate driver whose output voltage needs to be higher than 5V. In one gate driver circuit, sub-rails are generated to produce supply voltages between the gate driver's main supply voltage and ground to ensure that the 5V Vgs of the transistors are not exceeded. Such gate drivers unfortunately may include pass-transistors that produce the sub-rails that are large in order to provide a sufficiently large current when the main supply voltage to the gate driver is fairly low. Further, such gate drivers may not produce adequate output voltage and current at lower levels of supply voltage. However, the gate drivers described herein address these problems.

Figure 1:
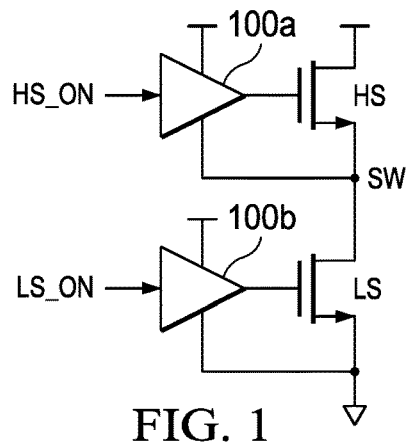
FIG. 1 is a circuit illustrating a pair of transistors, each transistor having a control input coupled to an output of a respective driver, in accordance with an example.

FIG. 1 shows an example of a HS transistor coupled to a LS transistor at a switch node (SW). A gate driver 100a is coupled to and drives a voltage on the gate of the HS transistor with respect to the SW node, and thus also connects to the SW node. A gate driver 100b is coupled to and drives a voltage on the gate of the LS transistor with respect to ground, and thus also connects to ground. HS_ON is an input control signal to gate drive 100a and dictates whether the HS transistor is to be on or off. LS_ON is an input control signal to gate driver 100b and dictates whether the LS transistor is to be on or off. Each gate driver 100a and 100b generally has the same circuit architecture, an example of which is shown in the schematic of FIG. 2.

Figure 2:
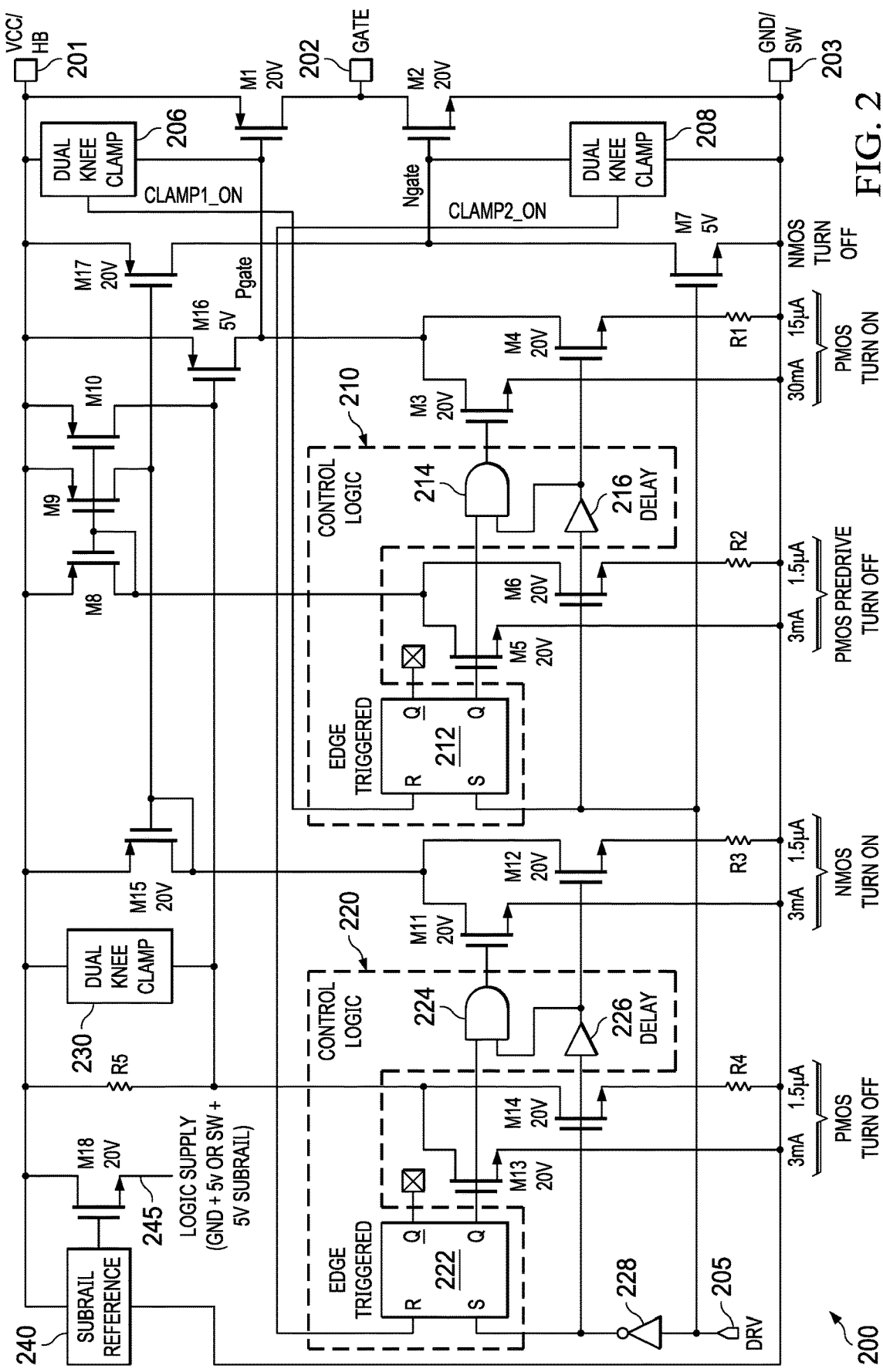
FIG. 2 is a gate driver circuit in accordance with an example.

FIG. 2 is a circuit schematic of a gate driver 200 in accordance with an example embodiment. Gate driver 200 can be used to implement either or both of gate drivers 100a and 100b of FIG. 1. Gate driver 200 includes voltage terminals 201 and 203 and a gate terminal 202. Gate 202 couples to the gate of the respective HS or LS transistor. Voltage terminal 203 couples to the SW node in the case of the HS transistor or to ground in the case of the LS transistor. Voltage terminal 201 is the supply voltage rail for the gate driver 200.

Gate driver 200 includes transistors M1-M18, resistors R1-R5, dual-knee clamps 206, 208, and 230, control logic circuit 210, control logic circuit 220, and inverter 228. M1 and M2 are coupled in series between voltage terminal 201 and voltage terminal 203. In this example, M1 is a P-type MOSFET (PMOS transistor), and M2 is an N-type MOSFET (NMOS transistor). The source of M1 is coupled to voltage terminal 201, and the source of M2 is coupled to voltage terminal 203. The drains of M1 and M2 are coupled together to form the gate terminal 202. The gate driver 200 receives an input control signal 205 labeled "DRV" in FIG. 2. Control signal DRV represents HS_ON or LS_ON in FIG. 1. Responsive to DRV being logic high ("1"), the gate driver 200 turns on M1 and turns off M2. With M1 being on, the voltage on the gate terminal 202 is forced high towards VCC. With M2 being on, the voltage on the gate terminal 202 is forced low towards ground/SW.

Dual-knee clamp 206 is coupled between voltage terminal 201 and the gate of M1. Dual-knee clamp 208 is coupled between the gate of M2 and the voltage terminal 203. Accordingly, dual-knee clamp 206 is coupled across the gate and source of M1, and dual-knee clamp is coupled across the gate and source of M2. Dual-knee clamp 206 ensures that the Vgs of M1 does not exceed a safe operating voltage. In one example, M1 and M2 are 5V (Vgs) transistors and thus dual-knee clamp 206 ensures that Vgs of M1 does not exceed 5V and dual-knee clamp 208 ensues that Vgs of M2 also does not exceed 5V. The drain-to-source voltage (Vds) of M1 and M2, however, are rated for much higher voltages (e.g., 20V).

M3 and M4 are NMOS transistors. The drains of M3 and M4 are coupled to the gate of M1. M1 is turned on in response to M3 and M4 being turned on. M3 is sized (size being the ratio of the channel width (W) to the channel length (L)) larger than M1. Accordingly, the current through M3 is larger than the current through M4. In one example, the current through M3 is 30 milli-amperes (mA), while the current through M4 is 15 micro-amperes. M3 thus represents a larger current path than the current path through M4 between the gate of M1 and the voltage terminal 203. Control logic 210 controls the on and off state of transistors M3 and M4 and thus the on and off states of the larger and smaller current paths between the gate of M1 and the voltage terminal 203. Control logic 210 includes an edge-triggered flip-flop 212, an AND gate 214, and a delay 216. When M1 is to be turned on (DRV asserted to logic high), the control logic circuit 210 turns on both M3 and M4 to discharge the gate of M1 very quickly and thus turn on M1 very quickly. Once M1 is on, then control logic circuit 210 turns off M3 (the larger current path) while maintaining M4 on to keep M1 in an on-state. In this example, each dual-knee clamp 206/208 generates an output control signal labeled CLAMP1_ON/CLAMP2_ON that indicates whether the respective dual-knee clamp has detected that the Vgs of the respective M1 and M2 transistor has exceeded the clamping voltage (e.g., 5V). This control signal is indicative of the respective M1 and M2 transistor being on. Control logic circuit 210 receives CLAMP1_ON from dual-knee clamp 206, and control logic circuit 220 receives CLAMP2_ON from dual-knee clamp 208. Control logic circuit 210 responds to assertion (e.g., logic high) of CLAMP1_ON by turning M3 off.

With M2 on and M1 off, the gate driver 200 operates as follows to turn on M1. The DRV signal 205 transitions from low to high to command the gate driver 200 to turn on M1. In response to a logic high assertion of DRV signal 205, M7 turns on pulling the gate of M2 towards ground thereby turning off M2 (or otherwise ensuring that M2 remains off). A positive assertion of the DRV signal 205 also turns on M6 and, through the set (S) input of flip-flop 212, also turns on M5. With M5 and M6 both on, current flows from voltage terminal 201 through M8 and through M5 and M6 to ground/SW terminal 203. M8, M9 and M10 are configured as a current mirror. The current through M8 is thus mirrored through M9 thereby turning off M17. M17 previously being on had turned on M2. Accordingly, with M17 off (and M7 on), M2 is ensured to be off.

The control logic 210 includes a delay 216 and an AND gate 214. The input of the delay 216 receives the DRV signal 205. The output of the delay is coupled to an input of the AND gate and to the gate of M4. The output of AND gate 214 is coupled to the gate of M3. The positive assertion of the DRV signal 204 sets the flip-flop thereby driving its Q output high to turn on M5 (as noted above) and to provide a logic high to one input of the AND gate 214. Following expiration of the delay time period implemented by delay 216, the other input of AND gate 214 is driven high, resulting in M3 being turned on. The expiration of the delay time period also results in M4 being turned on. The time delay from the positive assertion of the DRV signal 205 provides sufficient time to ensure that M2 is turned off before the control logic 210 attempts to turn on M1.

With M3 and M4 both being on, the combined current through the larger current path (M3) and the smaller current path (M4) flows from the gate of M1 to discharge M1's gate and rapidly turn on M1. With M1 on, the voltage on the gate terminal 202 rises rapidly towards the voltage on the voltage terminal 201. Further, the Vgs of M1 increases as M1 is turned on. Upon the Vgs of M1 reaching the clamping voltage implemented within the dual-knee clamp 206, the dual-knee clamp 206 activates preventing the Vgs of M1 from exceeding the clamping voltage (e.g., 5V). At the time that the dual-knee clamp activates to clamp the Vgs of M1, the dual-knee clamp 206 asserts CLAMP1_ON to a logic high level. CLAMP1_ON is coupled to the reset (R) input of flip-flop 212. Flip-flop 212 responds to the positive assertion of CLAMP1_ON by causing its Q output to become logic low. A logic low on the Q output of flip-flop 212 causes the output of AND gate 214 to become logic low thereby turning the larger current path (M3) off. The smaller current path (M4) remains on thereby maintaining M1 in an on-state. By turning M3 off, the average quiescent current of the gate driver 200 is reduced compared to what would have been the case if M3 was maintained on.

The operation of the gate driver 200 to turn off M1 and turn on M2 is similar to that described above. The control logic 220 also includes a flip-flop 222, AND gate 224, and delay 226. The gate driver 200 responds to a logic low assertion of the DRV signal by turning off M1 and turning on M2. Through inverter 228, the DRV signal 205 sets the flip-flop thereby forcing its Q output high. At this point, both M13 and M14 are on resulting in current flowing through resistor R5 thereby forcing the gate of M16 low enough to turn on M16 and thus turn off M1. While M1 is on and M2 is off, M7 is turned on preventing M2 from turning on, as explained above. When the DRV signal 205 becomes logic low to turn on M2, the DRV signal 205 causes M7 to turn off.

Following a delay (implemented by delay 226) from the negative edge of the DRV signal 205, both M11 and M12 are turned on thereby turning on a larger current path (M11) and a smaller current path (M12). The combined current flows through M15 and is mirrored through M17 thereby forcing the gate of M2 to increase and turn on.

Dual-knee clamp 208 ensures that the Vgs of M2 does not exceed the clamping voltage (e.g., 5V). Upon the Vgs of M2 reaching the clamping voltage of the dual-knee clamp 208, the dual-knee clamp 208 asserts a logic high state CLAMP2_ON, which resets flip-flop 222. In response to the Q output of flip-flop 222 becoming logic low, the larger current path implemented by M11 is turned off thereby reducing the average quiescent current of the gate driver 200.

The voltage on the voltage terminal 201 may be substantially higher than the maximum Vgs permitted for M1 and M2 (as well as the other transistors in the gate driver 200). The dual-knee clamps 206 and 208 protect M1 and M2 from experiencing a voltage difference between their gates and sources that might damage the transistors. In one example, M1 and M2 may be drain-extended transistors safely operating with a Vgs up to 5V and a Vds up to 20V. Further, the only subrail voltage in driver 200 is created on subrail 245 by the subrail reference 240 and M18. The subrail 245 is used to power the digital electronics including the flip-flops 212 and 222, the inverter 228, the delays 216 and 226, and the AND gates 214 and 224, and not any transistors through which the full output current of the gate driver flows.

While AND gates 214 and 224 are shown in the example of FIG. 2, in other examples, different types of logic gates or combinations of logic gates can be used.

The additional dual-knee clamp 230 is included for much the same reason as for dual-knee clamps 206 and 208. M16 in FIG. 2 is turned on by pulling its gate to ground with a relatively high current, and then a small current is used to maintain the on-state of M16. Dual-knee clamp 230 is used to protect the gate of M16. In alternative embodiments, a Zener diode can be used as a clamp to protect the gate of M16 because the high current for M16 is not as high as for M1 and M2.

It is possible that the voltage on the voltage terminal 201 is low enough with respect to ground/SW node terminal 203 that either or both of the dual-knee clamps 206 and 208 do not activate to clamp the Vgs of the respective M1 and M2. That is, the Vgs may remain below the clamping voltage of the dual-knee clamps. This condition could occur for lower levels of supply voltage (VCC). If this condition occurs, the dual-knee clamps will not assert their output control signals CLAMP1_ON and CLAMP2_ON. Further, if neither CLAMP1_ON nor CLAMP2_ON assert high, then the respective flip-flops 212 and 214 will not receive a logic high on their reset inputs and, accordingly, the larger current paths (M3 and M11) will remain on even after M1/M2 turn on.

Figure 3:
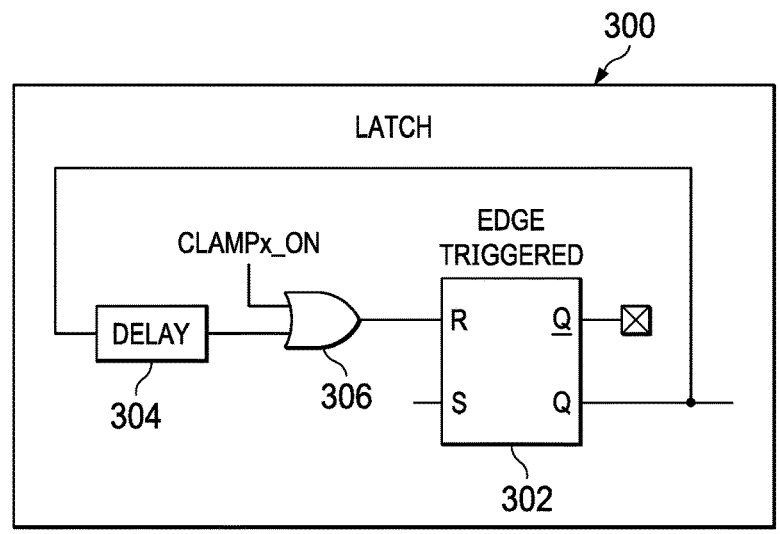
FIG. 3 is a logic circuit of a portion of the gate driver circuit of FIG. 2.

FIG. 3 is an example latch 300 usable to implement either or both of flip-flops 212 and 222 of FIG. 2. Latch 300 includes an RS flip-flop 302, a delay 304, and an OR gate 306. The Q output of the flip-flop 302 is coupled to an input of delay 304, and the delay's output is coupled to an input of OR gate 306. The other input of OR gate 306 is coupled to the respective dual-knee clamp and thus receives that clamp's CLAMP1_ON or CLAMP2_ON (CLAMPx_ON) output control signal. Thus, the flip-flop 302 is reset (positive assertion on its R input) when either the CLAMPx_ON signal is asserted high by the clamp or a fixed time delay after the flip-flop's Q output becomes logic high. Accordingly, the larger current path controlled by the flip-flop is turned off in response to the clamp detecting a Vgs of the respective M1 or M2 that equals the clamping voltage of the clamp, but is turned off regardless after it has been on for a fixed period of time that ensures that the corresponding M1 or M2 is fully on.

Figure 4:
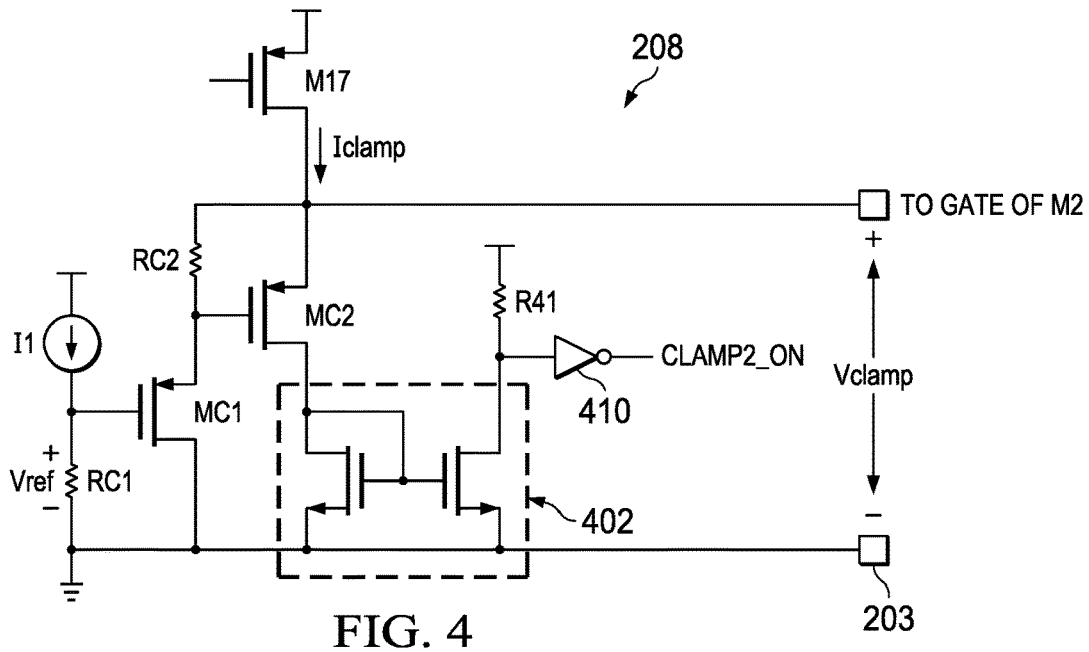
FIG. 4 is a circuit implementation of a dual-knee clamp usable in the gate driver of FIG. 2, in accordance with an example.
Figure 5:
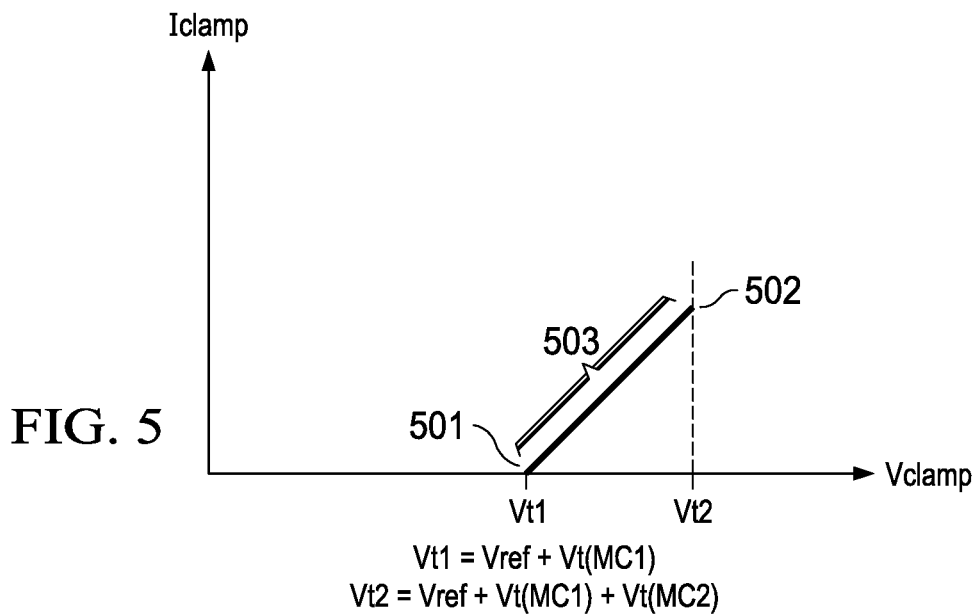
FIG. 5 is a graph illustrating the dual-knee operation of the dual-knee clamp, in accordance with an example.

FIG. 4 is an example circuit for implementing dual-knee clamp 208. FIG. 5 is a graph illustrating the dual-knee relationship between the current through the clamp (Iclamp) and the voltage difference (Vclamp) between the gate of M2 and voltage terminal 203. The first knee is illustrated at 501 and the second knee is illustrated at 502 in FIG. 5.

Dual-knee clamp 208 includes a current source I1 ("I1" referring both to the current source and the magnitude of the current it produces), resistors RC1, RC2, and R41, transistors MC1 and MC2, a current mirror 402, and an inverter 410. Resistor RC1 is coupled in series with current source I1 to produce a reference voltage (VREF, e.g., 3V) on the gate of MC1. That voltage fixes the gate voltage for MC1. As a PMOS device, MC1 will not turn on until its source voltage is more than the transistor's threshold voltage above its gate voltage. When M17 is turned on, the gate voltage on M2 increases. When the gate voltage of M2 is more than a threshold voltage of MC1 above MC1's gate voltage (VREF), MC1 turns on and the source of MC1 and gate of MC2 will be a threshold voltage above VREF. This is the first "knee" 501 in FIG. 5. In one example, the first knee is at a Vclamp voltage Vth1 of 4V.

As the voltage on the gate of M1 increases to the point where it is one threshold voltage above its gate voltage (e.g., 5V for a Vth1 of 4V, assuming the Vt of MC2 is 1V), MC2 also turns on. At that point (the second knee 502 in FIG. 5), both MC1 and MC2 are on. MC2 is a larger transistor than MC1 and thus more of the Iclamp current flows through MC2 than MC1. The Vgs of M17 is fixed by the gate voltage used to turn on M17 and the drain voltage of M17 which is the voltage of voltage terminal 201. Thus, M17 functions as a current source to produce a fixed current as Iclamp through the dual-knee clamp 208. The majority (e.g., 90%) of Iclamp flows through MC2. The voltage on the gate of MC2 is fixed and for the current to balance relative to the current source of M17 the voltage on the source of MC2 is set to a level that produces Iclamp current through MC2. Accordingly, the source voltage of MC2 remains fixed regardless of any further attempted increase in the gate voltage of M2.

Upon MC2 turning on, the current mirror 402 causes current to flow through resistor R41. Prior to MC2 turning on, the input of inverter 410 is pulled high through resistor R41, and thus the inverter's output (CLAMP2_ON) is logic low. When MC2 turns on (which occurs upon the voltage between the gate of M2 and terminal 203 reaching the second knee 502 in FIG. 5, the input to inverter 410 becomes logic low and CLAMP2_ON becomes logic high.

Figure 6:
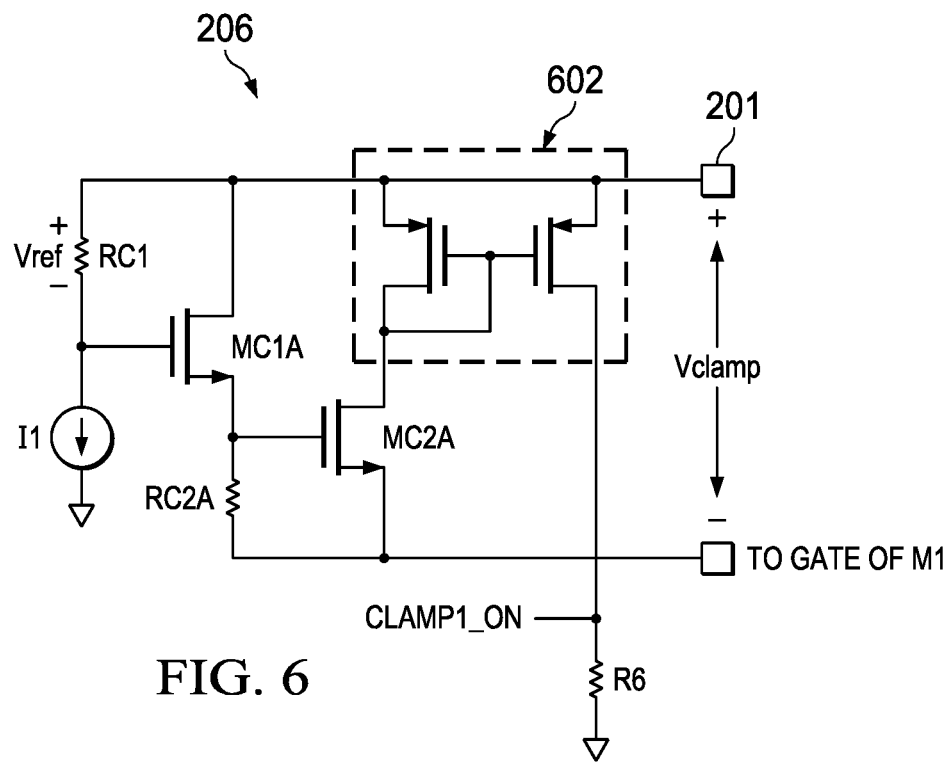
FIG. 6 is another circuit implementation of a dual-knee clamp usable in the gate driver of FIG. 2, in accordance with an example.

FIG. 6 is an example circuit for implementing dual-knee clamp 206. The architecture of this circuit is much the same as that for dual-knee clamp 208 in FIG. 4. PMOS devices MC1 and MC2 of FIG. 4 are NMOS devices MC1A and MC2A in FIG. 6. As the gate of M1 decreases, MC1A first turns on at a first knee, and then at a second knee, MC2A turns on. An inverter is not included in this example, as the voltage across R61 (CLAMP1_ON) is initially low before the clamp reaches the second knee. At that point, current flows through resistor R61 and CLAMP1_ON becomes logic high.

Figure 7:
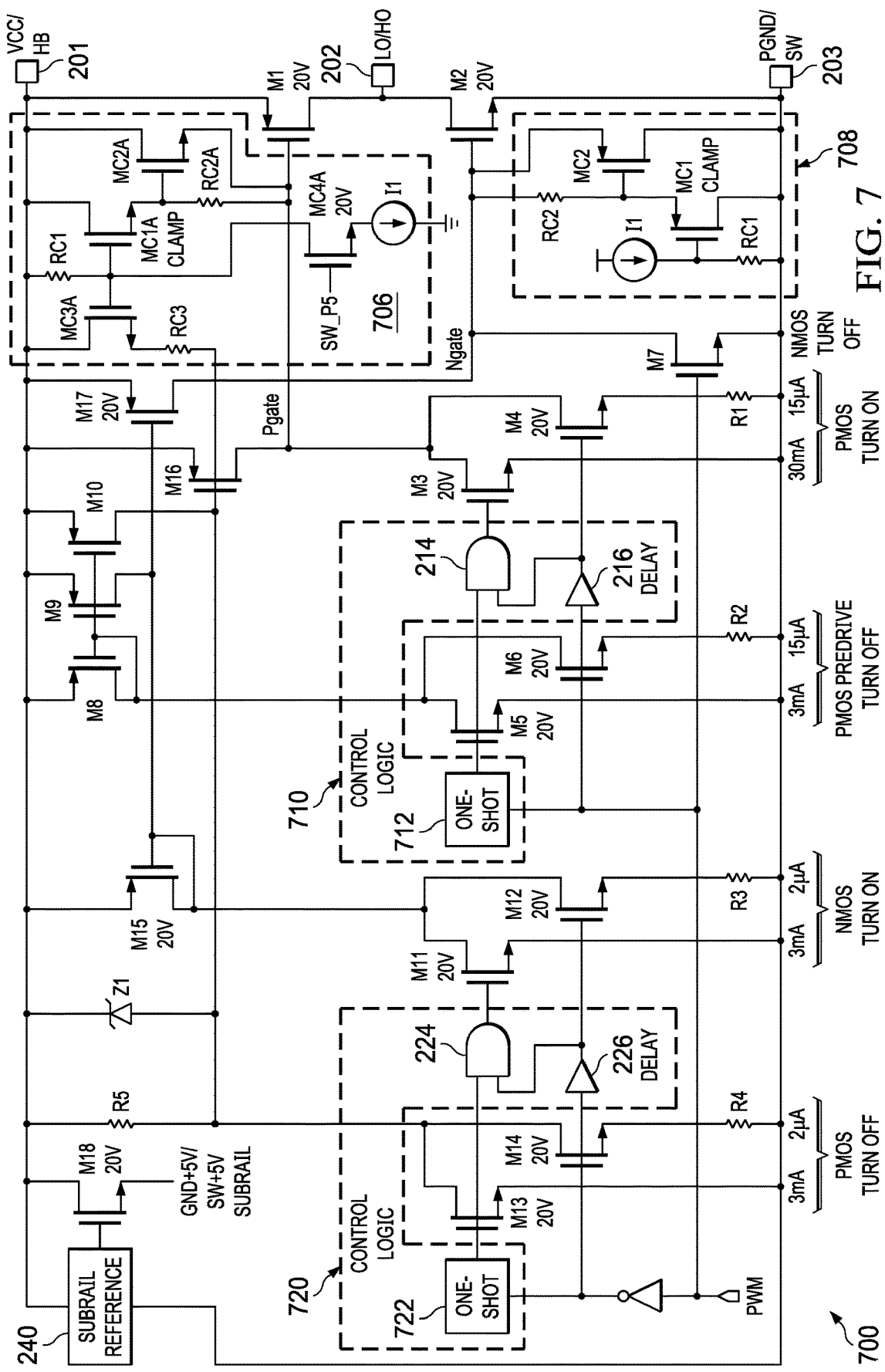
FIG. 7 is a gate driver circuit in accordance with another example.

FIG. 7 is a circuit schematic of a gate driver 700 in accordance with an example embodiment. Gate driver 700 can be used to implement either or both of gate drivers 100a and 100b of FIG. 1. Gate driver 700 is largely similar to gate driver 200 of FIG. 2. A difference is as follows. As explained above, gate driver 200 includes feedback control signals CLAMP1_ON and CLAMP2_ON from the dual-knee clamps 206 and 208 indicating that the respective M1 and M2 have been turned on, and control logic circuits 210 and 220 respond to assertions of CLAMP1_ON and CLAMP2_ON by turning off the respective larger current paths (M3 and M11). Gate driver 700, however, has dual-knee clamps 706 and 708 that are similar to corresponding dual-knee clamps 206 and 208 but do not have the output circuit components to generate the feedback control signals CLAMP1_ON and CLAMP2_ON. For example, compared to clamp 206 of FIG. 6, clamp 706 of FIG. 7 does not have current mirror 602 nor resistor R61 to generate CLAMP1_ON. Similarly, compared to clamp 208 of FIG. 4, clamp 708 of FIG. 7 does not have current mirror 402, resistor R41 nor inverter 410 to generate CLAMP2_ON. Clamp 706 is a dual-knee clamp for M1 as well as a dual-knee clamp for M16. In FIG. 2, two separate dual-knee clamps 206 and 230 were included for protecting M1 and M16, respectively, but in FIG. 7, a single dual-knee clamp provides the same functionality to protect M1 and M16. MC4A is a voltage protection device for the current source below it (I1). If current source I1 can handle the applicable voltages (e.g., 20V), MC4A may be omitted in other embodiments. MC3A and resistor RC3 are coupled together and provide the clamp for M16.

In FIG. 7, the control logic is identified as control logic circuits 710 and 720. Another difference between the gate drive 700 of FIG. 7 and gate driver 200 of FIG. 2 is that the control logic circuits 710 and 720 of FIG. 7 include one-shots 712 and 712 instead of flip-flops. These one-shots activate their respective larger current paths (M3) and (M11) for a defined period of time (the pulse width of the one-shot's output pulses) and thus the control logic circuits 710 and 720 do not rely on feedback control signals to specify when M1 and M2 have turned on. The width of the pulses from the one-shots is long enough to ensure that M1 and M2 have had sufficient time to turn on.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon field effect transistor ("MOSFET") may be used in place of an n-type MOSFET with little or no changes to the circuit. Furthermore, other types of transistors may be used (such as bipolar junction transistors (BJTs)). References to a "control input" of a transistor is the gate of a MOSFET or the base of a BJT. References to a "current terminal" of a transistor is the drain or source of a MOSFET or the collector or emitter of a BJT.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

Modifications are possible in the described embodiments, and other embodiments are possible, within the scope of the claims.

What is claimed is:

1. A gate driver circuit, comprising:
   a first transistor having a first control input and first and second current terminals, the first current terminal coupled to a first voltage terminal;
   a second transistor having a second control input and third and fourth current terminals, the fourth current terminal coupled to a second voltage terminal, and the second and third current terminals coupled together at an output terminal of the gate driver circuit;
   a first voltage clamp coupled between the first voltage terminal and the first control input;
   a second voltage clamp coupled between the second control input and the second voltage terminal;
   a first current path coupled between the first control input and the second voltage terminal;
   a second current path coupled between the first control input and the second voltage terminal, the first current path configured to provide a larger current than the second current path;
   control logic configured to turn on the first transistor by turning on both the first and second current paths, and the control logic configured to turn off the first current path after the first transistor is turned on while maintaining in an on-state the second current path to maintain the first transistor in the on-state.

2. The gate driver circuit of claim 1, wherein:
   the first voltage clamp includes a first voltage clamp control output, the first voltage clamp configured to assert a signal on the first voltage clamp control output in response to the voltage difference between the first voltage terminal and the first control input exceeding a threshold; and
   a flip-flop having a first input, a second input and an output, wherein the first input is coupled to the first voltage clamp control output.

3. The gate driver circuit of claim 2, further including a logic gate having a first input, a second input, and a logic gate output, wherein the first input of the logic gate is coupled to the output of the flip-flop, and the logic gate output is coupled to the first current path.

4. The gate driver circuit of claim 2, wherein the flip-flop is a set-reset flip-flop.

5. The gate driver circuit of claim 1, wherein the first voltage clamp is a dual-knee voltage clamp, and the second voltage clamp also is a dual-knee voltage clamp.

6. The gate driver circuit of claim 1, wherein the first voltage clamp comprises:
   a first resistor coupled to a current source at a third voltage terminal, a third transistor having a control input coupled to the third voltage terminal, the third transistor having a pair of current terminals; and a fourth transistor having a control input coupled to one of the pair of current terminals.

7. The gate driver circuit of claim 6, wherein the first voltage clamp further comprises:

a current mirror coupled to the other of the pair of current terminals; and a second resistor coupled to the current mirror, wherein a voltage of the second resistor is configured to generate the first voltage clamp control output.

8. The gate driver circuit of claim 1, wherein the control logic includes:

a one-shot having an input and an output;

a delay having an input coupled to the input of the one-shot, and the delay having an output; and a logic gate having first and second inputs, the first input coupled to the output of the one-shot, and the second input coupled to the output of the delay, the logic gate also having an output coupled to the first current path.

9. The gate driver circuit of claim 1, wherein the control logic is first control logic, and the gate driver circuit further includes:

a third current path configured to turn on the second transistor;

a fourth current path configured to turn on the second transistor, the third current path configured to provide a larger current than the fourth current path; and second control logic configured to turn on both the third and fourth current paths to thereby turn on the second transistor, and the second control logic is configured to turn off the third current path after the second transistor is on while maintaining in an on-state the fourth current path to maintain the second transistor in an on-state.

10. A gate driver circuit, comprising:

a first transistor having a first control input and first and second current terminals, the first current terminal coupled to a first voltage terminal;

a first voltage clamp coupled between the first voltage terminal and the first control input;

a second transistor coupled between the first control input and a second voltage terminal;

a third transistor coupled between the first control input and the second voltage terminal, the third transistor being smaller than the second transistor; and first control logic configured to turn on both the second and third transistors to thereby turn on the first transistor, and the first control logic configured to turn off the second transistor after the first transistor turns on while maintaining in an on-state the third transistor to maintain the first transistor in the on-state.

11. The gate driver circuit of claim 10, further comprising:

a fourth transistor having a second control input and third and fourth current terminals, the fourth current terminal coupled to the second voltage terminal, and the second and third current terminals coupled together at an output terminal of the gate driver circuit;

a second voltage clamp coupled between the second control input and the second voltage terminal;

a fifth transistor configured to, when on, turn on the fourth transistor;

a sixth transistor configured to, when on, turn on the fourth transistor, the sixth transistor being smaller than the fifth transistor; and second control logic configured to turn on both the fifth and sixth transistors to thereby turn on the fourth transistor, and the second control logic configured to turn off the fifth transistor after the fourth transistor is turned on while maintaining in an on-state the sixth transistor to maintain the fourth transistor in the on-state.

12. The gate driver circuit of claim 10, wherein:

the first voltage clamp includes a first voltage clamp control output, the first voltage clamp configured to assert a signal on the first voltage clamp control output in response to the voltage difference between the first voltage terminal and the first control input exceeding a threshold; and a flip-flop having a first input, a second input and an output, wherein the first input is coupled to the first voltage clamp control output.

13. The gate driver circuit of claim 12, further including a logic gate having a first input, a second input, and a logic gate output, wherein the first input of the logic gate is coupled to the output of the flip-flop, and the logic gate output is coupled to the first current path.

14. The gate driver circuit of claim 10, wherein the first voltage clamp is a dual-knee voltage clamp.

15. The gate driver circuit of claim 10, wherein the first voltage clamp comprises:

a first resistor coupled to a current source at a third voltage terminal, a fourth transistor having a control input coupled to the third voltage terminal, the fourth transistor having a pair of current terminals; and a fifth transistor having a control input coupled to one of the pair of current terminals.

16. The gate driver circuit of claim 15, wherein the first voltage clamp includes a voltage clamp output control terminal, and the first voltage clamp is configured to generate a signal on the voltage clamp output control terminal that is indicative of a voltage difference between the first voltage terminal and the first control input reaching a clamping voltage threshold.

17. A gate driver circuit, comprising:

a first transistor having a first control input and first and second current terminals, the first current terminal coupled to a first voltage terminal;

a second transistor having a second control input and third and fourth current terminals, the fourth current terminal coupled to a second voltage terminal, and the second and third current terminals coupled together at an output terminal of the gate driver circuit;

a first current path having a first current value, the first current path coupled between the first control input and the second voltage terminal;

a second current path having a second current value, the second current path coupled between the first control input and the second voltage terminal, wherein the second current value is greater than the first current value;

a first dual-knee voltage clamp coupled between the first voltage terminal and the first control input, the first dual-knee voltage clamp configured to clamp a voltage difference between the first voltage terminal and the first control input at a first voltage clamping threshold; and a second dual-knee voltage clamp coupled between the second control input and the second voltage terminal, the second dual-knee voltage clamp configured to clamp a voltage difference between the second control input and the second voltage terminal at a second voltage clamping threshold.

18. The gate driver circuit of claim 17, wherein at least one of the first or second dual-knee voltage clamps comprises:
- a first resistor coupled to a current source at a third voltage terminal;
- a third transistor having a control input coupled to the third voltage terminal, the third transistor having a pair of current terminals; and
- a fourth transistor having a control input coupled to one of the pair of current terminals.

19. The gate driver circuit of claim 18, wherein the fourth transistor is larger than the second transistor.

20. The gate driver circuit of claim 18, wherein the at least one of the first or second dual-knee voltage clamps further includes:
- a current mirror; and
- a second resistor coupled to the current mirror, wherein a voltage of the second resistor is configured to generate a first voltage clamp control output.

* * * * *